United States Patent [19]
Hladik et al.

[11] Patent Number: 5,734,962
[45] Date of Patent: Mar. 31, 1998

[54] SATELLITE COMMUNICATIONS SYSTEM UTILIZING PARALLEL CONCATENATED CODING

[75] Inventors: Stephen Michael Hladik, Albany, N.Y.; William Alan Check; Brian James Glinsman, both of Herndon, Va.; Robert Fleming Fleming, III, Derwood, Md.

[73] Assignee: General Electric Company, Schenectady, N.Y.

[21] Appl. No.: 684,276

[22] Filed: Jul. 17, 1996

[51] Int. Cl.⁶ ................................................. H04B 7/185
[52] U.S. Cl. .............. 455/12.1; 455/21; 370/342; 371/37.4; 371/43; 375/200
[58] Field of Search ................ 455/12.1, 13.1, 455/13.2, 13.3, 19, 20, 21, 427, 428, 430, 73; 370/316, 320, 342, 503, 513, 514, 515; 375/200, 205; 371/37.4, 43, 46

[56] References Cited

U.S. PATENT DOCUMENTS

| Re. 32,905 | 4/1989 | Baran | 455/12.1 |
|---|---|---|---|
| 4,032,886 | 6/1977 | En et al. | 371/46 |
| 5,400,347 | 3/1995 | Lee | 371/37.4 |
| 5,416,804 | 5/1995 | Khaled et al. | 371/37.4 |
| 5,625,624 | 4/1997 | Rosen et al. | 455/12.1 |

FOREIGN PATENT DOCUMENTS

B-13079/92  9/1992  Australia ................... 371/46

OTHER PUBLICATIONS

"Optimal Decoding of Linear Codes for Minimizing Symbol Error Rate", by Bahl, Cocke, Jelinek & Raviv, IEEE Transactions on Information Theory, pp. 284–287, Mar. 1974.

"Decision Depths of Convolutional Codes", by Anderson & Balachandran, IEEE Transactions on Information, vol. 35, No. 2, pp. 455–459, Mar. 1989.

"An Algorithmic Approach", by Anderson and Mohan, pp. 216 and 336–342.

Primary Examiner—Reinhard J. Eisenzopf
Assistant Examiner—Thanh Le
Attorney, Agent, or Firm—Jill M. Breedlove

[57] ABSTRACT

A VSAT satellite communications network utilizes parallel concatenated coding on its inbound or outbound links, or both. For short data blocks, nonrecursive systematic tail-biting convolutional codes are used. For longer data blocks, recursive systematic convolutional codes are used. These parallel concatenated coding techniques are used in conjunction with spread-spectrum modulation to provide a VSAT communications system which meets FCC regulations on the total power spectral density of transmitted signals as well as mitigates interference from adjacent satellites.

12 Claims, 4 Drawing Sheets ns/ SATELLITE COMMUNICATIONS SYSTEM UTILIZING PARALLEL CONCATENATED CODING

FIELD OF THE INVENTION

The present invention relates generally to satellite communications systems and, more particularly, to a very small aperture terminal satellite communications system employing parallel concatenated coding on its inbound or outbound links, or both.

BACKGROUND OF THE INVENTION

There is an emerging market for multi-media communications via satellite using low-cost, very small aperture terminals (VSAT's). Advantages of utilizing a smaller antenna than is currently the general practice in the industry today include a reduced reflector cost, lower shipping costs, reduced mounting hardware and labor, and greater customer acceptance due to a less obtrusive appearance. However, the use of a smaller-aperture dish antenna can cause an undesirable reduction in network capacity. This is due to several causes related to the reduced antenna size: (1) decreased received and transmitted signal power caused by the associated decrease in antenna gain; and (2) Federal Communications Commission (FCC) regulations limiting the power transmitted by a VSAT utilizing an antenna smaller than a specified size in order to limit the interfering power flux density at adjacent satellite orbital slots. The use of a VSAT power amplifier with the same or less power output in order to reduce VSAT cost further contributes to the decrease in network capacity due to power limitations.

Unfortunately, it is difficult to obtain the desired large coding gain on short data blocks (that are typical of some types of VSAT transmissions) to solve these problems with the required bandwidth efficiency and decoder complexity using conventional coding techniques.

Accordingly, it is desirable to provide a satellite communications system that increases network capacity when VSAT's with reduced antenna apertures are used by decreasing the required energy-per-bit-to-noise power-spectral-density ratio $E_b/N_o$ with spectrally efficient techniques.

SUMMARY OF THE INVENTION

In accordance with the present invention, a VSAT satellite communications network utilizes parallel concatenated coding on its inbound or outbound links, or both. In one embodiment, for short data blocks that are typical of packet transmissions, credit card transactions, and compressed voice communications, nonrecursive systematic tail-biting convolutional codes are used as the component codes in such a parallel concatenated coding scheme. For longer data blocks that are typical of file transmission, the VSAT and network's hub terminal utilize recursive systematic convolutional codes.

In a preferred embodiment, the aforementioned parallel concatenated coding techniques are used in conjunction with spread-spectrum modulation, resulting in a system which meets FCC regulations on the total power spectral density of transmitted signals and mitigates interference from adjacent satellites.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

The invention described herein is a VSAT satellite communications system utilizing parallel concatenated coding techniques involving, for example, parallel concatenated tail-biting convolutional codes and parallel concatenated recursive systematic convolutional codes (i.e., so-called "turbo codes"), and their respective decoders. In particular, for parallel concatenated tail-biting convolutional codes, a decoder comprising circular MAP decoding is employed, such as described in commonly assigned, copending U.S. patent application Ser. No. 08/636,742 of Stephen M. Hladik and John B. Anderson, filed Apr. 19, 1996 and incorporated by reference herein.

Parallel concatenated coding is used on the inbound-link transmissions (VSAT-to-hub) or outbound-link transmissions (hub-to-VSAT) or both links of a VSAT satellite communications network. In addition, parallel concatenated coding can be utilized to provide error correction/detection coding for direct peer-to-peer (VSAT-to-VSAT) transmissions. In one embodiment, for short data blocks that are typical of packet transmissions, credit card transactions, and compressed voice communications, nonrecursive systematic tail-biting convolutional codes are used as the component codes in a parallel concatenated coding scheme. For longer data blocks that are typical of file transmission, parallel concatenated coding comprising recursive systematic convolutional codes is utilized by the VSAT's and the network's hub terminal.

In accordance with the present invention, the use of these parallel concatenated coding techniques in conjunction with spread-spectrum modulation provides a very effective solution to facilitate compliance with the aforementioned FCC regulations on adjacent satellite interference by decreasing the required effective radiated power (ERP) and the power spectral density of the transmitted signal. In addition, this combination mitigates interference from adjacent satellites.

Figure 1:
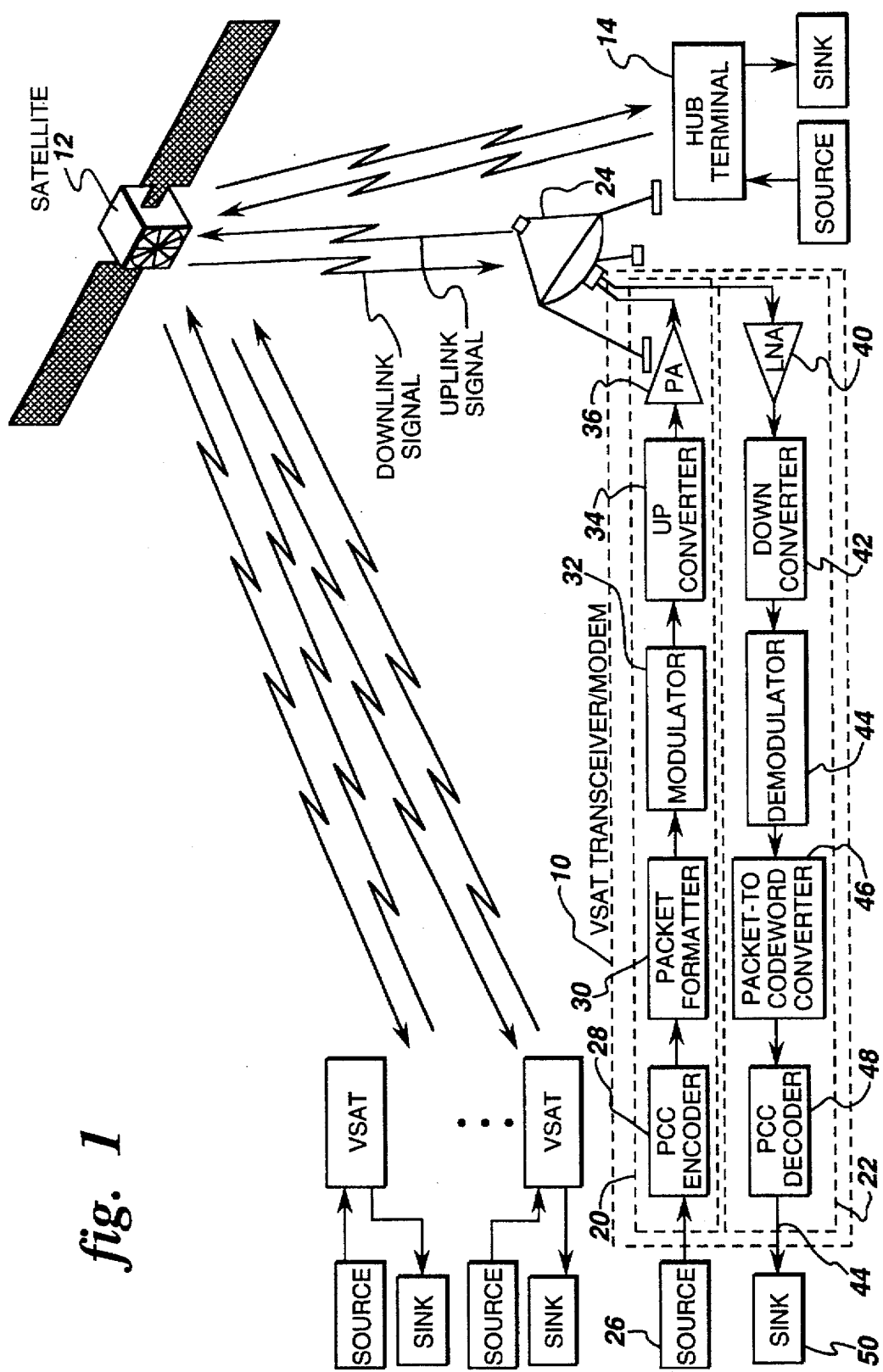
FIG. 1 is a simplified block diagram illustrating a VSAT communications system employing parallel concatenated coding in accordance with the present invention.

FIG. 1 is a block diagram of a VSAT satellite communications system that employs parallel concatenated coding in accordance with the present invention. This system fundamentally comprises a number of VSAT terminals 10, a satellite 12 with a communications transponder, and possibly a hub terminal 14. Communication within the VSAT network may be either one-way or two-way and may travel in a variety of paths: (1) VSAT-to-VSAT directly (i.e., mesh connectivity) and (2) VSAT-to-hub-terminal and/or hub-terminal-to-VSAT (i.e., star connectivity).

As shown in FIG. 1, a VSAT terminal 10 comprises transmitter signal processing 20, receiver signal processing 22 and an antenna 24. In accordance with the invention described herein, the VSAT's transmitter signal processing comprises the following: an input port 25 for accepting data from an information source 26; an encoder 28 that applies a parallel concatenated code to blocks of data bits received from the source; a packet formatter 30 for generating a data packet (comprising one or more codewords from encoder 28), a synchronization bit pattern and control signaling bits; a modulator 32; an up-converter 34 for translating the modulated signal to the carrier frequency; a power amplifier 36; and connection to antenna 24 via an appropriate interface (e.g., a switch or filter duplexer). The VSAT's receiver signal processing comprises: a low-noise amplifier 40, a down-converter 42 for translating the received signal from the carrier frequency to an intermediate frequency, a demodulator 44 for synchronization and demodulation, a packet-to-codeword formatter 46, a decoder 48 suitable for the parallel concatenated code utilized by the transmitter, and an output port 49 for transferring received messages (i.e., blocks of data bits) to an information sink 50. For brevity, a detailed block diagram is only shown for one VSAT in FIG. 1.

The synchronization functions performed by demodulator 44 include carrier frequency synchronization, frame synchronization, symbol synchronization, and, if needed, carrier phase synchronization. Symbol synchronization is the process of estimating the best sampling time (i.e., the symbol epoch) for the demodulator output in order to minimize the probability of a symbol decision error. Frame synchronization is the process of estimating the symbol epoch for the first symbol in a received data frame (for continuous transmissions) or packet (for discontinuous transmissions).

For the case in which spread spectrum signals are transmitted by the VSAT, the VSAT modulator shown in FIG. 1 includes the spreading function; and the VSAT demodulator shown in FIG. 1 includes the despreading function. Spread spectrum techniques increase the signal bandwidth relative to the bandwidth of the modulated data signal by imposing a spreading signal comprising chips (in the case of direct sequence spread spectrum) or hops (in the case of frequency hopping spread spectrum) that are pseudorandom and independent of the data signal. In direct sequence spread spectrum, the data signal is multiplied by a signal that corresponds to a pseudorandom sequence of chips having the values of +1 or −1. The duration of the chip pulses is less than the symbol interval of the modulated data signal; hence, the resulting signal's bandwidth is greater than that of the original modulated signal. In frequency hopping spread spectrum, the carrier frequency of the modulated signal is changed periodically according to a pseudorandom pattern. Again, the bandwidth of the spread signal is greater than that of the original modulated signal.

Despreading in the demodulator is the process of removing the spreading from the received signal. Typically, the demodulator correlates the received signal with a replica of the spreading waveform to despread a direct sequence spread spectrum signal, while in a frequency hopping spread spectrum system, it hops the frequency of an oscillator in the receiver's down converter using the same pattern employed by the transmitting terminal to despread a frequency hopped spread spectrum signal. Typically, a filter is applied to the received signal after despreading to attenuate wide-band noise and interference components in the recovered signal.

Figure 2:
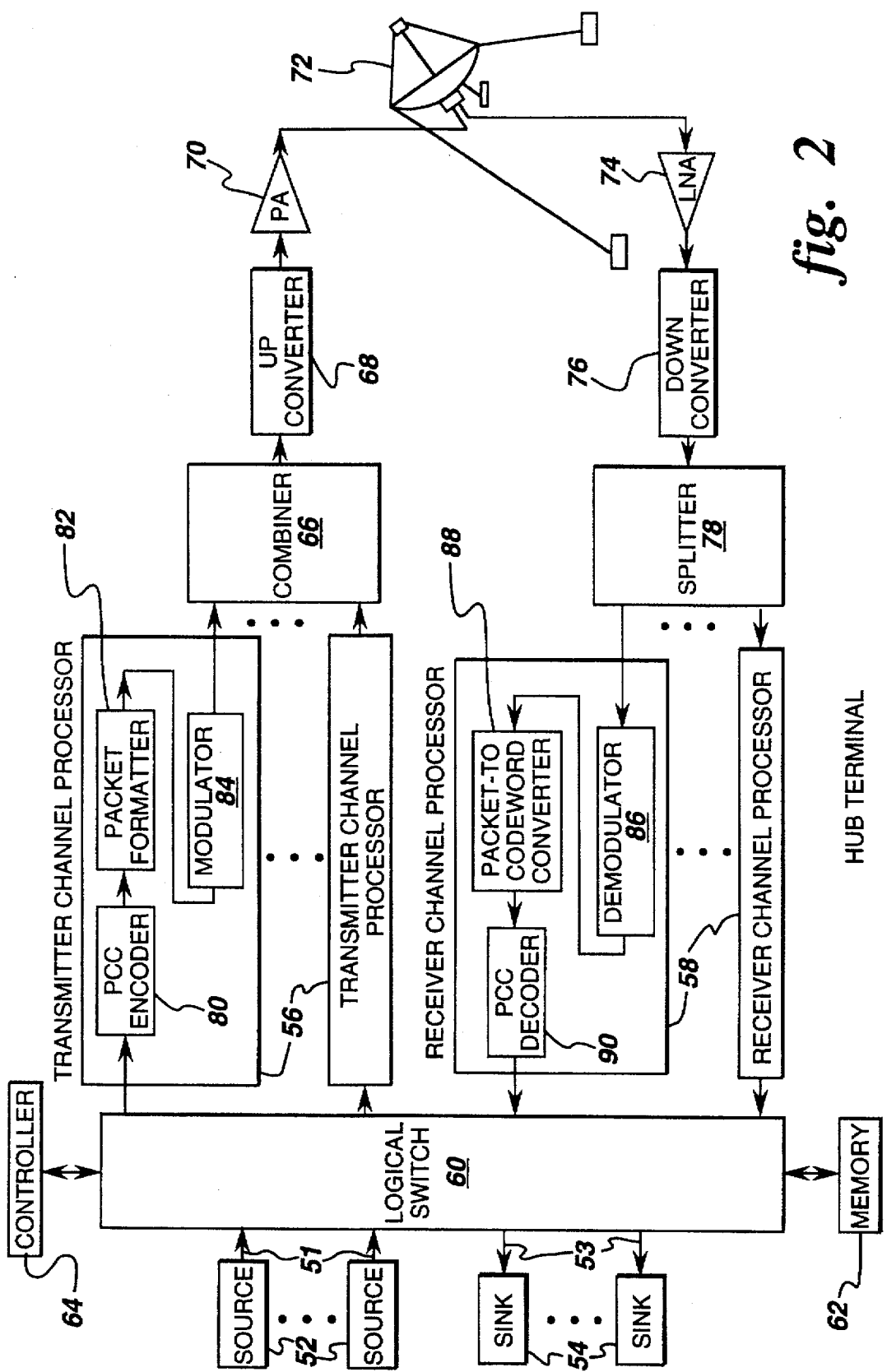
FIG. 2 is a simplified block diagram illustrating a VSAT satellite communications system's hub terminal employing parallel concatenated coding according to the present invention.

A block diagram of the hub terminal is presented in FIG. 2. In accordance with the invention described herein, it comprises: input ports 51 for accepting data from one or more information sources 52; output ports 53 for transferring received messages (i.e., blocks of data bits) to one or more information sinks 54; a bank of transmitter channel processors 56; a bank of receiver channel processors 58; a switch 60 for connecting each active source to a transmitter channel processor and for connecting each active receiver channel processor to the appropriate information sink or a transmitter channel processor; a memory 62; a controller 64 for controlling the flow of data through the switch; a combiner 66 for combining the signals generated by each transmitter channel processor into one signal; an up-converter 68 for translating the combined signals to the carrier frequency; a power amplifier 70 connected to the antenna via an appropriate interface (e.g., a switch or filter duplexer); an antenna 72; a low-noise amplifier 74 that is coupled to the antenna via the aforementioned interface; a down-converter 76 for translating the received signal from the carrier frequency to an intermediate frequency (IF); and a signal splitter 78 for providing the IF received signal or possibly a filtered version of the IF received signal to the bank of receiver channel processors.

The transmitter channel processor shown in FIG. 2 comprises: an encoder 80 that applies a parallel concatenated code to blocks of data bits received from a source; a packet formatter 82 for generating a data packet (comprising one or more codewords from encoder 80), a synchronization bit pattern and control signaling bits; and a modulator 84. As with the VSAT, the hub's modulators include the spreading function for the case in which spread spectrum signals are transmitted by the hub. The receiver channel processor of FIG. 2 comprises a demodulator 86, a packet-to-codeword converter 88 for selecting samples from the demodulator output to form the received codewords that are inputted to a decoder for parallel concatenated codes, and a decoder 90 suitable for the parallel concatenated code utilized by the transmitter. The hub's demodulators include several functions: synchronization, demodulation, and, for the case in which the hub receives spread spectrum signals, despreading.

One function of the hub's memory is to temporarily store data received from the information sources or receiver channel processors in the event that all transmitter channel processors or output ports are busy when a message arrives at switch 60. The memory also stores necessary network configuration parameters and operational data.

In one alternative embodiment of the present invention, an outer code is used in series concatenation with the (inner) parallel concatenated code (PCC); an associated outer decoder is also connected in series concatenation with the decoder for the inner PCC.

Additionally, a flexible, programmable encoder/decoder system may be utilized by the VSAT and hub equipment for implementing several options:

(1) parallel concatenated coding as described hereinabove;

(2) an outer code in series concatenation with an inner parallel concatenated code (PCC) as described hereinabove;

(3) serial concatenated coding comprising an outer encoder and only one component encoder of a PCC encoder;

(4) a conventional convolutional code or block code alone (i.e., without series or parallel concatenation).

Figure 3:
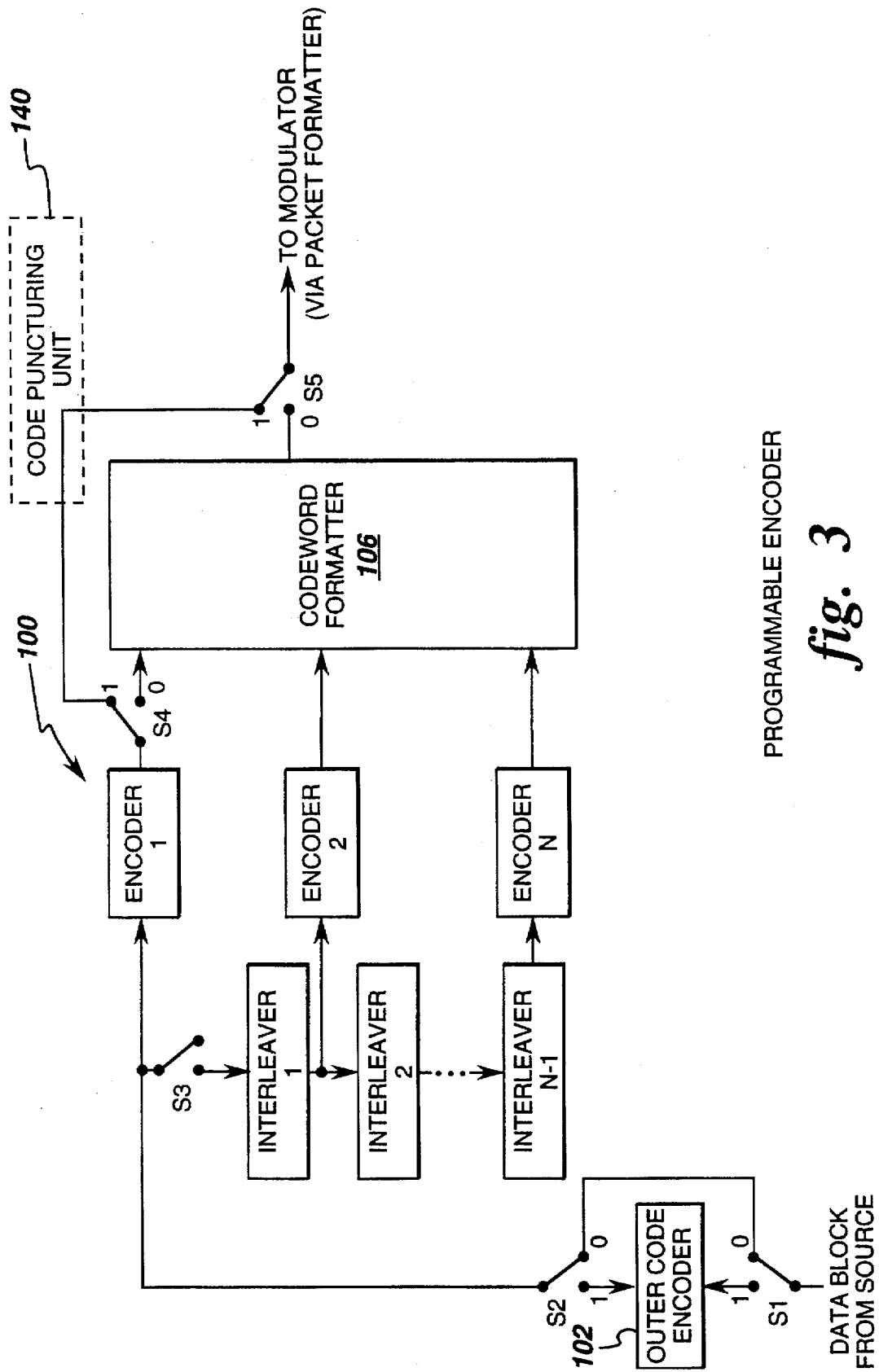
FIG. 3 is a simplified block diagram illustrating a programmable encoder useful in a VSAT communications system according to the present invention.

FIG. 3 illustrates a block diagram of a flexible, programmable encoder that implements these four coding options. As shown, the flexible, programmable encoder comprises an encoder 100 for parallel concatenated codes, an encoder 102 for an outer code, and five switches S1–S5. Encoder 100 for parallel concatenated codes comprises N encoders, N−1 interleavers, and a codeword formatter 106. Table I as follows summarizes the switch positions for various modes of encoder operation.

TABLE I

| Mode | Switch Positions | | | | |
|---|---|---|---|---|---|
| | S1 | S2 | S3 | S4 | S5 |
| (1) PCCC | 0 | 0 | CLOSED | 0 | 0 |
| (2) Serial concatenation with inner PCC | 1 | 1 | CLOSED | 0 | 0 |
| (3) Standard serial concatenation | 1 | 1 | OPEN | 1 | 1 |
| (4) Single code | 0 | 0 | OPEN | 1 | 1 |

Figure 4:
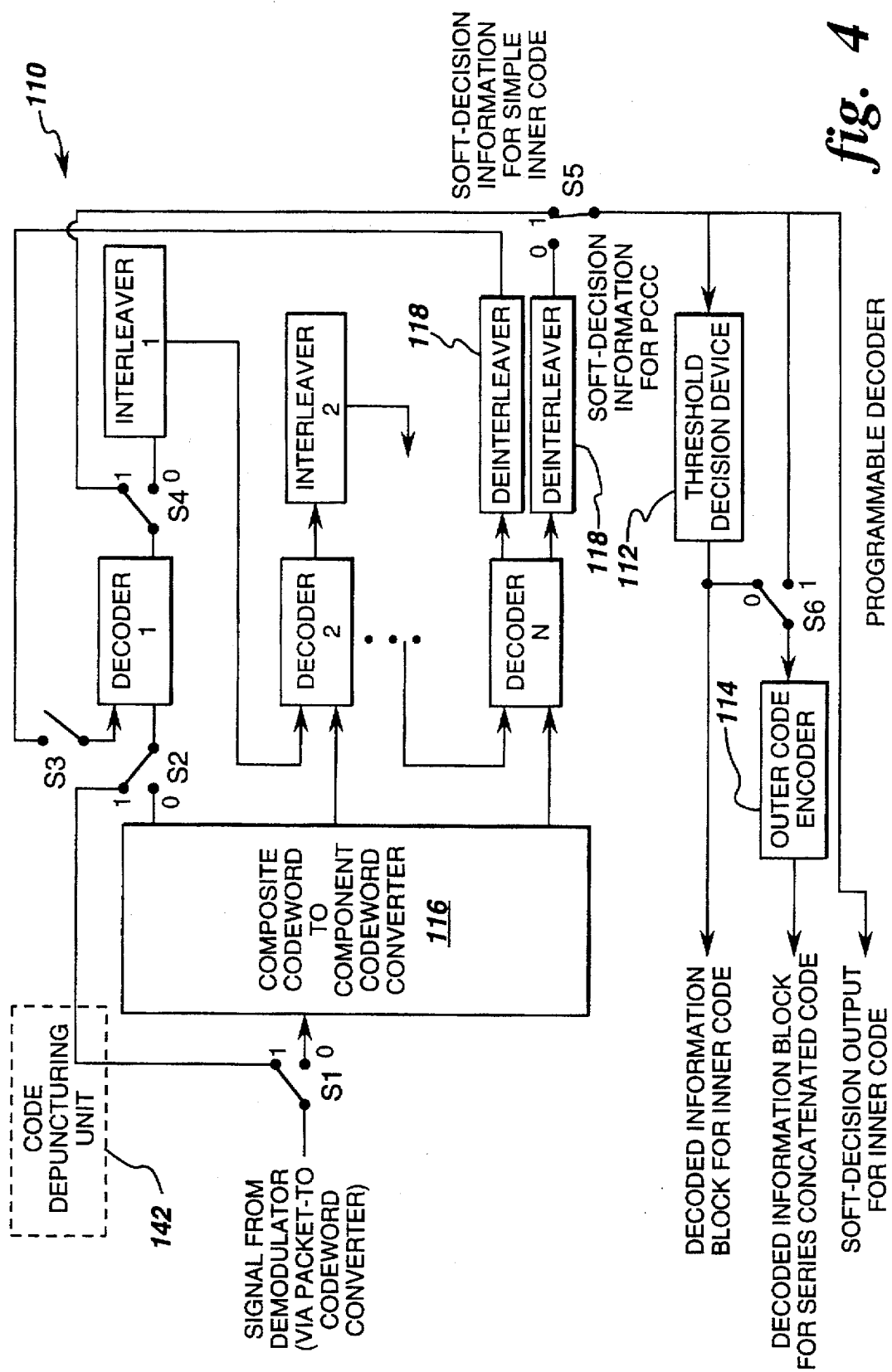
FIG. 4 is a simplified block diagram illustrating a programmable decoder useful in a VSAT communications system according to the present invention.

FIG. 4 is a block diagram of a flexible, programmable decoder that implements the decoders for the four encoder modes presented hereinabove. This programmable composite decoder comprises a decoder 110 for parallel concatenated codes, a threshold decision device 112 for implementing a decision role, a decoder 114 for an outer code, and six switches S1–S6. Assuming that the output of decoder 110 is the probability that the value of the decoded bit equals zero, an exemplary decision rule is: If the output is greater than ½, then decide that the decoded bit is zero; if less than ½, then assign the value one; if equal to ½, then arbitrarily assign a value.

Decoder 110 for parallel concatenated codes further comprises a composite codeword to component codeword converter 116, N component decoders, N–1 interleavers and two identical deinterleavers 118. Each deinterleaver has a reordering function that returns a sequence of data elements that have been permuted by the N–1 interleavers connected in series to their original order. Table II as follows summarizes the switch positions for various modes of decoder operation. (In the table, X denotes the "don't care" condition, i.e., the switch may be in either position.)

TABLE II

| Mode | Switch Positions | | | | | |
|---|---|---|---|---|---|---|
| | S1 | S2 | S3 | S4 | S5 | S6 |
| (1) PCC | 0 | 0 | CLOSED | 0 | 0 | X |
| (2) Serial concatenation with inner PCC | 0 | 0 | CLOSED | 0 | 0 | 0 for hard-decision decoding; 1 for soft-decision decoding |
| (3) Standard serial concatenation | 1 | 1 | OPEN | 1 | 1 | 0 for hard-decision decoding; 1 for soft-decision decoding |
| (4) Single code | 1 | 1 | OPEN | 1 | 1 | X |

The VSAT's utilize different codes (e.g., PCCC, tailbiting PCCC, recursive systematic convolutional, nonrecursive systematic convolutional, block codes) in different combinations (e.g., modes 1, 2, 3, and 4), depending on the communication application and required transmission rates.

When convolutional codes are utilized in any of the modes described hereinabove, the programmable encoder of FIG. 3 may also include puncturing via a known pattern to increase the rate of the resulting code, and the programmable decoder of FIG. 4 may also include the associated depuncturing function. When punctured convolutional codes are used as the component codes in parallel concatenated coding, the codeword formatter of FIG. 3 deletes code bits from the component codewords according to the desired puncturing patterns. In this case, the PCC decoder's composite codeword to component codeword converter inserts neutral values for the punctured bits in the component codewords that it outputs to the component decoders. Note that in Mode 3 or Mode 4, encoder switches S4 and S5 and decoder switches S1 and S2 are all set to position 0. Therefore, FIGS. 3 and 4 show puncturing unit 140 and depuncturing unit 142, respectively, in phantom for implementing these puncturing and depuncturing functions, respectively, when a punctured convolutional code is used in Mode 3 or Mode 4.

In a preferred embodiment of this invention, convolutional codes are used as the component codes in an inner parallel concatenated code, and a block code (e.g., a Reed-Solomon code or BCH code) is used as an outer code in serial concatenation.

In a preferred embodiment in which spread spectrum signals are transmitted by the VSAT's, a random channel access protocol such as ALOHA is used in conjunction with code division multiple access. The hub receiver utilizes a number of demodulators for each spreading code in order to receive time-overlapping signals that utilize time-delayed versions of the same spreading sequence. Each demodulator for a given spreading sequence demodulates a signal using a different time shift of that spreading sequence.

Also in a preferred embodiment, one or more spreading sequences are reserved for use by VSAT's over specified periods of time on an assigned basis in order to provide higher-quality channels with greater throughput. Reservation requests from the VSAT's and assignments are processed by a network controller that is connected to a hub terminal.

In a preferred embodiment that utilizes spread spectrum signals and the programmable encoder and decoder described hereinabove, the system associates a given spreading sequence with a particular error correcting code to allow different signals to utilize different error correcting codes simultaneously. Since each detected signal's spreading sequence is identified by a corresponding demodulator, the receiver can appropriately configure the programmable decoder for each detected signal. This mode of network operation is useful for simultaneously supporting several applications having different error correction coding requirements without the need for additional control signaling.

A circular MAP decoder useful as the component decoders in FIG. 4 is described in commonly assigned, copending U.S. patent application Ser. No. 08/636,742. The circular MAP decoder can deliver both an estimate of the encoded data block and reliability information to a data sink, e.g., a speech synthesis signal processor for use in transmission error concealment or protocol processor for packet data as a measure of block error probability for use in repeat request decisions. As described in commonly assigned, copending U.S. patent application Ser. No. 08/636,732 of Stephen M. Hladik and John B. Anderson, filed Apr. 19, 1996 and incorporated by reference herein, the circular MAP decoder is useful for decoding tail-biting convolutional codes, particularly when they are used as component codes in a parallel concatenated coding scheme.

A circular MAP decoder for error-correcting trellis codes that employ tail biting according to U.S. patent application Ser. No. 08/636,742 produces soft-decision outputs. The circular MAP decoder provides an estimate of the probabilities of the states in the first stage of the trellis, which probabilities replace the a priori knowledge of the starting state in a conventional MAP decoder. The circular MAP decoder provides the initial state probability distribution in either of two ways. The first involves a solution to an eigenvalue problem for which the resulting eigenvector is the desired initial state probability distribution; with knowledge of the starting state, the circular MAP decoder performs the rest of the decoding according to the conventional MAP decoding algorithm. The second is based on a recursion for which the iterations converge to a starting state distribution. After sufficient iterations, a state on the circular sequence of states is known with high probability, and the circular MAP decoder performs the rest of the decoding according to the conventional MAP decoding algorithm which is set forth in "Optimal Decoding of Linear Codes for Minimizing Symbol Error Rate," by Bahl, Cocke, Jelinek and Raviv, *IEEE Transactions on Information Theory*, pp. 284–287, Mar. 1974.

The objective of the conventional MAP decoding algorithm is to find the conditional probabilities:

$$P\{\text{state } m \text{ at time } t/\text{receive channel outputs } y_1, \ldots, y_L\}.$$

The term L in this expression represents the length of the data block in units of the number of encoder symbols. (The encoder for an (n, k) code operates on k-bit input symbols to generate n-bit output symbols.) The term $Y_t$ is the channel output (symbol) at time t.

The MAP decoding algorithm actually first finds the probabilities:

$$\lambda_t(m) = P\{S_t = m; Y_1^L\}; \quad (1)$$

that is, the joint probability that the encoder state at time t, $S_t$, is m and the set of channel outputs $Y_1^L = \{y_1, \ldots, Y_L\}$ is received. These are the desired probabilities multiplied by a constant ($P\{Y_1^L\}$, the probability of receiving the set of channel outputs $\{y_1, \ldots, y_L\}$).

Now define the elements of a matrix $\Gamma_t$ by $$\Gamma_t(i,j) = P\{\text{state } j \text{ at time } t; y_t/\text{state } i \text{ at time } t-1\}.$$

The matrix $\Gamma_t$ is calculated as a function of the channel transition probability $R(Y_t, X)$, the probability $p_t(m/m')$ that the encoder makes a transition from state m' to m at time t, and the probability $q_t(X/m',m)$ that the encoder's output symbol is X given that the previous encoder state is m' and the present encoder state is m. In particular, each element of $\Gamma_t$ is calculated by summing over all possible encoder outputs X as follows:

$$\gamma_t(m',m) = \sum_X p_t(m|m') q_t(X|m',m) R(Y_t, X). \quad (2)$$

The MAP decoder calculates L of these matrices, one for each trellis stage. They are formed from the received channel output symbols and the nature of the trellis branches for a given code.

Next define the M joint probability elements of a row vector $\alpha_t$ by $$\alpha_t(j) = P\{\text{state } j \text{ at time } t; y_1, \ldots, y_t\} \quad (3)$$

and the M conditional probability elements of a column vector $\beta_t$ by $$\beta_t(j) = P\{y_{t+1}, \ldots, y_L/\text{state } j \text{ at time } t\} \quad (4)$$

for j=0,1, . . . ,(M–1) where M is the number of encoder states. (Note that matrices and vectors are denoted herein by using boldface type.)

The steps of the MAP decoding algorithm are as follows:

(i) Calculate $\alpha_1, \ldots, \alpha_L$ by the forward recursion:

$$\alpha_t = \alpha_{t-1} \Gamma_t, \ t=1, \ldots, L. \quad (5)$$

(ii) Calculate $\beta_1, \ldots, \beta_{L-1}$ by the backward recursion:

$$\beta_t = \Gamma_{t+1} \beta_{t+1}, \ t=L-1, \ldots, 1. \quad (6)$$

(iii) Calculate the elements of $\lambda_t$ by:

$$\lambda_t(i) = \alpha_t(i) \beta_t(i), \text{ all } i, \ t=1, \ldots, L. \quad (7)$$

(iv) Find related quantities as needed. For example, let $A_t^j$ be the set of states $S_t = \{S_t^1, S_t^2, \ldots, S_t^{km}\}$ such that the $j^{th}$ element of $S_t$, $S_t^j$, is equal to zero. For a conventional non-recursive trellis code, $S_t^j = d_t^j$, the $j^{th}$ data bit at time t. Therefore, the decoder's soft-decision output is $$P\{d_t^j = 0/Y_1^L\} = \frac{1}{P\{Y_1^L\}} \sum_{S_t \in A_t^j} \lambda_t(m)$$

where $$P\{Y_1^L\} = \sum_m \lambda_L(m)$$

and m is the index that corresponds to a state $S_t$.

The decoder's hard-decision or decoded bit output is obtained by applying $P\{d_t^j=0/Y_1^L\}$ to the following decision rule:

$$P\{d_t^j = 0/Y_1^L\} \begin{matrix} \hat{d}_t^j = 0 \\ > \\ < \\ \hat{d}_t^j = 1 \end{matrix} \frac{1}{2};$$

That is, if $P\{d_t^j=0/Y_1^L\} > \frac{1}{2}$, the $\hat{d}_t^j = 0$; if $P\{d_t^j=0/Y_1^L\} < \frac{1}{2}$, then $\hat{d}_t^j = 1$; otherwise, arbitrarily assign $d_t^j$ the value 0 or 1. As another example of a related quantity for step (iv) hereinabove, the matrix of probabilities $\sigma_t$ comprises elements defined as follows:

$$\sigma_t(i,j) = P\{S_{t-1}=i; S_t=j; H_1^L\} \alpha_{t-1}(i) \gamma_t(i,j) \beta_t(j)$$

These probabilities are useful when it is desired to determine the a posteriori probability of the encoder output bits. These probabilities are also useful in the decoding of recursive convolutional codes.

In the standard application of the MAP decoding algorithm, the forward recursion is initialized by the vector $\alpha_0 = (1,0, \ldots 0)$, and the backward recursion is initialized by $\beta_L = (1,0, \ldots 0)^T$. These initial conditions are based on assumptions that the encoder's initial state $S_0 = 0$ and its ending state $S_L = 0$.

One embodiment of the circular MAP decoder determines the initial state probability distribution by solving an eigenvalue problem as follows. Let $\alpha_t$, $\beta_t$, $\Gamma_t$ and $\lambda_t$ be as before, but take the initial $\alpha_0$ and $\beta_L$ as follows:

Set $\beta_L$ to the column vector $(111 \ldots 1)^T$.

Let $\alpha_0$ be an unknown (vector) variable.

Then, (i) Calculate $\Gamma_t$ for t=1, 2, . . . L according to equation (2).

(ii) Find the largest eigenvalue of the matrix product $\Gamma_1 \Gamma_2 \ldots \Gamma_L$. Normalize the corresponding eigenvector so that its components sum to unity. This vector is the solution for $\alpha_0$. The eigenvalue is $P\{Y_1^L\}$.

(iii) Form the succeeding $\alpha_t$ by the forward recursion set forth in equation (5).

(iv) Starting from $\beta_L$, initialized as above, form the $\beta_t$ by the backward recursion set forth in equation (6).

(v) Form the $\lambda_t$ as in (7), as well as other desired variables, such as, for example, the soft-decision output $P\{d^j_t=0/Y^L_1\}$ or the matrix of probabilities $\sigma_t$, described hereinabove.

The unknown variable $\alpha_0$ satisfies the matrix equation $$\alpha_0 = \frac{\alpha_0 \Gamma_1 \Gamma_2 \ldots \Gamma_L}{P\{Y^L_1\}}.$$

Based on the fact that this formula expresses a relationship among probabilities, the product of $\Gamma_t$ matrices on the right has largest eigenvalue equal to $P\{Y^L_1\}$, and that the corresponding eigenvector must be a probability vector.

With the initial $\beta_L=(111\ldots 1)^T$, equation (6) gives $\beta_{L-1}$. Thus, repeated applications of this backward recursion give all the $\beta_t$. Once $\alpha_0$ is known and $\beta_L$ is set, all computations in the circular MAP decoder follow the conventional MAP decoding algorithm.

An alternative embodiment of the circular MAP decoder determines the state probability distributions by a recursion method. In particular, in one embodiment (the dynamic convergence method), the recursion continues until decoder convergence is detected. In this recursion (or dynamic convergence) method, steps (ii) and (iii) of the eigenvector method described hereinabove are replaced as follows:

(ii.a) Starting with an initial $\alpha_0$ equal to $(1/M, \ldots, 1/M)$, where M is the number of states in the trellis, calculate the forward recursion L times. Normalize the results so that the elements of each new $\alpha_t$ sum to unity. Retain all L $\alpha_t$ vectors.

(ii.b) Let $\alpha_0$ equal $\alpha_L$ from the previous step and, starting at t=1, calculate the first $L_{w_{min}}$ $\alpha_t$ probability vectors again.

That is, calculate $$\alpha_t(m) = \sum_{i=0}^{M-1} \alpha_{t-1}(i)\gamma_t(i,m)$$

for $m=0, 1, \ldots, M-1$ and $t=1,2,\ldots,L_{w_{min}}$ where $L_{w_{min}}$ is a suitable minimum number of trellis stages. Normalize as before. Retain only the most recent set of L $\alpha$'s found by the recursion in steps (ii.a) and (ii.b) and the $\alpha_{L_{w,min}}$ found previously in step (ii.a).

(ii.c) Compare $\alpha_{L_{w,min}}$ from step (ii.b) to the previously found set from step (ii.a). If the M corresponding elements of the new and old $\alpha_{L_{w,min}}$ are within a tolerance range, proceed to step (iv) set forth hereinabove. Otherwise, continue to step (ii.d).

(ii.d) Let $t=t+1$ and calculate $\alpha_t=\alpha_{t-1}\Gamma_t$. Normalize as before. Retain only the most recent set of L $\alpha$'s calculated and the $\alpha_t$ found previously in step (ii.a).

(ii.e) Compare the new $\alpha_t$'s to the previously found set. If the M new and old $\alpha_t$'s are within a tolerance range, proceed to step (iv). Otherwise, continue with step (ii.d) if the two most recent vectors do not agree to within the tolerance range and if the number of recursions does not exceed a specified maximum (typically 2L); proceeding to step (iv) otherwise.

This method then continues with steps (iv) and (v) given hereinabove with respect to the eigenvector method to produce the soft-decision outputs and decoded output bits of the circular MAP decoder.

In another alternative embodiment of the circular MAP decoder described in U.S. patent application Ser. No. 08/636,742, the recursion method is modified so that the decoder only needs to process a predetermined, fixed number of trellis stages for a second time, that is, a predetermined wrap depth. This is advantageous for implementation purposes because the number of computations required for decoding is the same for every encoded message block. Consequently, hardware and software complexities are reduced.

One way to estimate the required wrap depth for MAP decoding of a tail-biting convolutional code is to determine it from hardware or software experimentation, requiring that a circular MAP decoder with a variable wrap depth be implemented and experiments be conducted to measure the decoded bit error rate versus $E_b/N_o$ for successively increasing wrap depths. The minimum decoder wrap depth that provides the minimum probability of decoded bit error for a specified $E_b/N_o$ is found when further increases in wrap depth do not decrease the error probability.

If a decoded bit error rate that is greater than the minimum achievable at a specified $E_b/N_o$ is tolerable, it is possible to reduce the required number of trellis stages processed by the circular MAP decoder. In particular, the wrap depth search described hereinabove may simply be terminated when the desired average probability of bit error is obtained.

Another way to determine the wrap depth for a given code is by using the code's distance properties. To this end, it is necessary to define two distinct decoder decision depths. As used herein, the term "correct path" refers to the sequence of states or a path through the trellis that results from encoding a block of data bits. The term "incorrect subset of a node" refers to the set of all incorrect (trellis) branches out of a correct path node and their descendants. Both the decision depths defined below depend on the convolutional encoder.

The decision depths are defined as follows:

(i) Define the forward decision depth for e-error correction, LF(e), to be the first depth in the trellis at which all paths in the incorrect subset of a correct path initial node, whether later merging to the correct path or not, lie more than a Hamming distance 2e from the correct path. The significance of LF(e) is that if there are e or fewer errors forward of the initial node, and encoding is known to have begun there, then the decoder must decode correctly. A formal tabulation of forward decision depths for convolutional codes was provided by J. B. Anderson and K. Balachandran in "Decision Depths of Convolutional Codes", *IEEE Transactions on Information Theory*, vol. IT-35, pp. 455–59, Mar. 1989. A number of properties of LF(e) are disclosed in this reference and also by J. B. Anderson and S. Mohan in *Source and Channel Coding—An Algorithmic Approach*, Kluwer Academic Publishers, Norwell, Mass., 1991. Chief among these properties is that a simple linear relation exists between LF and e; for example, with rate ½ codes, LF is approximately 9.08e.

(ii) Next define the unmerged decision depth for e-error correction, LU(e), to be the first depth in the trellis at which all paths in the trellis that never touch the correct path lie more than a Hamming distance of 2e away from the correct path.

The significance of LU(e) for soft-decision circular MAP decoding is that the probability of identifying a state on the actual transmitted path is high after the decoder processes LU(e) trellis stages. Therefore, the minimum wrap depth for circular MAP decoding is LU(e). Calculations of the depth LU(e) show that it is always larger than LF(e) but that it obeys the same approximate law. This implies that the minimum wrap depth can be estimated as the forward decision depth LF(e) if the unmerged decision depth of a code is not known.

By finding the minimum unmerged decision depth for a given encoder, we find the fewest number of trellis stages that must be processed by a practical circular decoder that generates soft-decision outputs. An algorithm to find LF(e), the forward decision depth, was given by J. B. Anderson and K. Balachandran in "Decision Depths of Convolutional Codes", cited hereinabove. To find LU(e):

(i) Extend the code trellis from left to right, starting from all trellis nodes simultaneously, except for the zero-state.

(ii) At each level, delete any paths that merge to the correct (all-zero) path; do not extend any paths out of the correct (zero) state node.

(iii) At level k, find the least Hamming distance, or weight, among paths terminating at nodes at this level.

(iv) If this least distance exceeds 2e, stop. Then, LU(e)=k.

As described in U.S. patent application Ser. No. 08/636,742, experimentation via computer simulation lead to two unexpected results: (1) wrapped processing of $\beta_t$ improves decoder performance; and (2) the use of a wrap depth of LU(e)+LF(e)≈2LF(e) improves performance significantly. Hence, a preferred embodiment of the circular MAP decoder algorithm based on recursion comprises the following steps:

(i) Calculate $\Gamma_t$ for t=1, 2, ... L according to equation (2).

(ii) Starting with an initial $\alpha_0$ equal to (1/M, ..., 1/M), where M is the number of states in the trellis, calculate the forward recursion of equation (5) (L+$L_w$) times for u=1, 2, ... (L+$L_w$) where $L_w$ is the decoder's wrap depth. The trellis-level index t takes on the values ((u−1) mod L)+1. When the decoder wraps around the received sequence of symbols from the channel, $\alpha_L$ is treated as $\alpha_0$. Normalize the results so that the elements of each new $\alpha_t$ sum to unity. Retain the L most recent $\alpha$ vectors found via this recursion.

(iii) Starting with an initial $\beta_L$ equal to (1, ..., 1)$^T$, calculate the backward recursion of equation (6) (L+$L_w$) times for u=1, 2, ... (L+$L_w$). The trellis-level index t takes on the values L−(u mod L). When the decoder wraps around the received sequence, $\beta_1$ is used as $\beta_{L+1}$ and $\Gamma_1$ is used as $\Gamma_{L+1}$ when calculating the new $\beta_L$. Normalize the results so that the elements of each new $\Gamma_t$ sum to unity. Again, retain the L most recent $\beta$ vectors found via this recursion.

The next step of this recursion method is the same as step (v) set forth hereinabove with respect to the eigenvector method to produce the soft-decisions and decoded bits output by the circular MAP decoder.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A VSAT communications system for communication via satellite, comprising:

a plurality of VSAT terminals each comprising:

a parallel concatenated encoder comprising a plurality of component encoders connected in a parallel concatenation, the parallel concatenated encoder applying a parallel concatenated code to a block of data bits received from a source and generating component codewords therefrom, the parallel concatenated encoder comprising a codeword formatter for formatting the bits of the component codewords to provide a composite codeword;

a packet formatter for assembling data packets for transmission, each data packet comprising bits from at least one composite codeword;

a modulator for receiving the data packets and providing modulated signals therefrom;

an up-converter for translating modulated signals to a carrier frequency;

an interface for connecting each respective VSAT terminal to an antenna for transmitting modulated signals to the satellite and receiving modulated signals from the satellite;

a down-converter for translating each received signal from the carrier frequency to an intermediate frequency;

a demodulator for synchronizing to and demodulating the received signals;

a packet-to-codeword formatter for forming received composite codewords from the demodulated signals; and a composite decoder comprising a plurality of component decoders for decoding the received composite codewords.

2. The communications system of claim 1 wherein the component encoders comprising the parallel concatenated encoder apply convolutional codes to the block of data bits.

3. The communications system of claim 2 wherein the parallel concatenated convolutional code comprises recursive systematic codes.

4. The communications system of claim 2 wherein the parallel concatenated convolutional code comprises tail-biting nonrecursive systematic codes.

5. The communications system of claim 4 wherein the component decoders comprise circular MAP decoders.

6. The communications system of claim 1 wherein the modulator comprises a spread spectrum modulator, and the demodulator comprises a despreading demodulator.

7. The communications system of claim 1 wherein:

the parallel concatenated code comprises an inner parallel concatenated code connected in series concatenation with an outer code; and the decoder comprises an inner decoder associated with the inner parallel concatenated code and further comprises an outer decoder associated with the outer series concatenated code.

8. The communications system of claim 1 wherein the encoder and decoder comprise a programmable encoder/decoder system comprising a plurality of coding options selectable via switches.

9. The communications system of claim 8 comprising four coding/decoding options:

(1) parallel concatenated coding;

(2) an outer code in series concatenation with an inner parallel concatenated code;

(3) serial concatenated coding comprising an outer encoder and an inner single component encoder; and (4) a single code such that only one component encoder is utilized.

10. The communications system of claim 8, further comprising at least one hub terminal;

the modulator of each VSAT terminal comprising a spread spectrum modulator for applying one of a plurality of spreading sequences to each data packet to be transmitted, the spreading sequences being grouped into sets, each set comprising at least one spreading sequence, each set of spreading sequences being associated with one of the coding options;

the hub terminal comprising at least one despreading demodulator for each spreading sequence and a plurality of decoders, said hub terminal demodulating and decoding signals received from the satellite which are transmitted in time-overlapping intervals and which signals each utilize one of the coding options and one of the spreading sequences associated therewith, the decoders being configured for each received signal based on the spreading sequence identified by the despreading demodulator.

11. The communications system of claim 1, further comprising at least one hub terminal for providing star connectivity.

12. The communications system of claim 1 wherein the parallel concatenated encoder further comprises a puncturing function for deleting code bits from the component codewords according to a predetermined puncturing pattern, and the composite decoder comprises a depuncturing function for inserting neutral values for the punctured bits in the component codewords.

* * * * *